US011289387B2

(12) United States Patent
Lianto et al.

(10) Patent No.: US 11,289,387 B2
(45) Date of Patent: Mar. 29, 2022

(54) METHODS AND APPARATUS FOR BACKSIDE VIA REVEAL PROCESSING

(71) Applicant: APPLIED MATERIALS, INC., Santa Clara, CA (US)

(72) Inventors: Prayudi Lianto, Singapore (SG); Sik Hin Chi, Singapore (SG); Shih-Chao Hung, Singapore (SG); Pin Gian Gan, Singapore (SG); Ricardo Fujii Vinluan, Singapore (SG); Gaurav Mehta, Singapore (SG); Ramesh Chidambaram, Singapore (SG); Guan Huei See, Singapore (SG); Arvind Sundarrajan, Singapore (SG); Upendra V. Ummethala, Cupertino, CA (US); Wei Hao Kew, Singapore (SG); Muhammad Adli Danish Bin Abdullah, Singapore (SG); Michael Charles Kutney, Santa Clara, CA (US); Mark McTaggart Wylie, Meridian, ID (US); Amulya Ligorio Athayde, Palo Alto, CA (US); Glen T. Mori, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/944,285

(22) Filed: Jul. 31, 2020

(65) Prior Publication Data

US 2022/0037216 A1 Feb. 3, 2022

(51) Int. Cl.
*H01L 21/768* (2006.01)
*H01L 21/66* (2006.01)
(Continued)

(52) U.S. Cl.
CPC ........ *H01L 22/26* (2013.01); *H01L 21/02271* (2013.01); *H01L 21/304* (2013.01);
(Continued)

(58) Field of Classification Search
CPC .............. H01L 22/26; H01L 21/76898; H01L 21/31053; H01L 21/30625; H01L 21/304;
(Continued)

(56) References Cited

U.S. PATENT DOCUMENTS 6,366,841 B1  1/2002  Chang
6,954,678 B1  10/2005  Phan et al.
(Continued)

FOREIGN PATENT DOCUMENTS

WO     WO 2017/117568 A1     7/2017

OTHER PUBLICATIONS

Nouredine Rassoul, Anne Jourdain, Nina Tutunjyan, Joeri Devos, Stefano Sardo, Daniele Piumi, Andy Miller, Eric Beyne, Characterization of Optical End-point Detection for Via Reveal Processing, 2018 IEEE 68th Electronic Components and Technology Conference, Unit Process Module, ETCH BEOL Imec vzw, Kapeldreef 75, B-3001 Leuven, Belgium nouredine.rassoul@imec.be, pp. 1181-1187.

(Continued)

*Primary Examiner* — Vu A Vu
(74) *Attorney, Agent, or Firm* — Moser Taboada

(57) ABSTRACT

Methods and apparatus perform backside via reveal processes using a centralized control framework for multiple process tools. In some embodiments, a method for performing a backside via reveal process may include receiving process tool operational parameters from process tools involved in the backside via reveal process by a central controller, receiving sensor metrology data from at least one or more of the process tools involved in the backside via
(Continued)

reveal process, and altering the backside reveal process based, at least in part, on the process tool operational parameters and the sensor metrology data by adjusting two or more of the process tools involved in the backside via reveal process. The profile parameters are configured to prevent backside via breakage during a chemical mechanical polishing (CMP) process.

18 Claims, 6 Drawing Sheets

(51) Int. Cl.
  *H01L 21/304* (2006.01)
  *H01L 21/306* (2006.01)
  *H01L 21/02* (2006.01)
  *H01L 21/3105* (2006.01)
  *H01L 21/683* (2006.01)

(52) U.S. Cl.
  CPC .. *H01L 21/30604* (2013.01); *H01L 21/30625* (2013.01); *H01L 21/31053* (2013.01); *H01L 21/6835* (2013.01); *H01L 21/76898* (2013.01); *H01L 2221/68327* (2013.01); *H01L 2221/68372* (2013.01)

(58) Field of Classification Search
  CPC ............. H01L 21/0227; H01L 21/6835; H01L 21/30604; H01L 2221/68327; H01L 2221/68372
  USPC .............................................................. 438/5
  See application file for complete search history.

(56) References Cited

U.S. PATENT DOCUMENTS

| | | |
|---|---|---|
| 8,709,268 B2 | 4/2014 | Ansell |
| 9,102,033 B2* | 8/2015 | Hui ........................ B24B 37/042 |
| 2005/0095774 A1 | 5/2005 | Ushiku et al. |
| 2006/0046166 A1 | 3/2006 | Yang et al. |
| 2007/0122921 A1 | 5/2007 | Shanmugasundram et al. |
| 2009/0198635 A1 | 8/2009 | Doddi et al. |
| 2010/0935518 | 2/2010 | Chang et al. |
| 2011/0171758 A1 | 7/2011 | Su et al. |
| 2014/0329439 A1* | 11/2014 | Chew ................... B24B 37/0053 451/5 |
| 2016/0126148 A1 | 5/2016 | Mauer et al. |
| 2016/0148850 A1 | 5/2016 | David |

OTHER PUBLICATIONS

International Search Report for PCT PCT/US2021/043598, dated Nov. 18, 2021.

* cited by examiner

METHODS AND APPARATUS FOR BACKSIDE VIA REVEAL PROCESSING

FIELD

Embodiments of the present principles generally relate to semiconductor processing of semiconductor substrates.

BACKGROUND

During the formation of integrated circuits, multi-dimensional packaging may be used such as 3D packaging. In such cases, vertical connections or vias may be used to connect the integrated circuits found at different levels of the packaged circuit. The vias are essentially vertical conductors that pass through the substrate. In order to access the vias from a backside of the substrate to make further connections, a chemical mechanical polishing or CMP process may be used to reveal a surface of the vias. A backside via reveal (BVR) process may include grinding, polishing, and etching of the backside to expose or reveal the vias such that the vias extend above the backside surface. A dielectric film can then be deposited over the vias and another CMP process may be used to expose a connection surface of the vias on the backside surface after deposition. The inventors have observed that during the final CMP process, the vias may bend or break off, causing damage to the vias and the backside surface.

Accordingly, the inventors have provided improved methods and apparatus for enhanced control of the backside via reveal processes.

SUMMARY

Methods and apparatus for enhancing control of a backside via reveal process are provided herein.

In some embodiments, a method for performing a backside via reveal process may comprise receiving, by a central controller, process tool operational parameters from process tools involved in the backside via reveal process, receiving, by the central controller, metrology sensor data from at least one or more of the process tools involved in the backside via reveal process, and altering, by the central controller, the backside reveal process based, at least in part, on the process tool operational parameters and the metrology sensor data by adjusting profile parameters of two or more of the process tools involved in the backside via reveal process, wherein the profile parameters are configured to prevent backside via breakage during a chemical mechanical polishing (CMP) process.

In some embodiments, the method may also include wherein the process tools involved in the backside via reveal process include a CMP chamber, an etch chamber, and a chemical vapor deposition (CVD) chamber, storing, by the central controller, the process tool operational parameters and the metrology sensor data in a database, determining, by the central controller, adjustments for the two or more of the process tools by using a machine learning model based, at least in part, on the process tool operational parameters and the metrology sensor data, sending and receiving, by the central controller, metrology sensor data between two or more of the process tools involved in the backside via reveal process as a substrate is processed to automatically adjust the two or more of the process tools before a subsequent substrate is processed in the two or more of the process tools, wherein the backside via reveal process includes temporarily bonding and back grinding a backside of a substrate, performing a first chemical mechanical polishing (CMP) process on the backside of the substrate, etching the backside of the substrate to create recesses around vias, depositing a passivation layer on the backside of the substrate, and performing a second CMP process to reveal vias on the backside of the substrate, wherein the sensor metrology data for the bonding and back grinding includes temporary bonding voids, amount of warpage, total thickness variation (TTV), and surface roughness data, wherein the sensor metrology data for the CMP processes include total thickness variation (TTV), embedded via profile, surface roughness, and via breakage data, wherein the sensor metrology data for etching includes recess depth and via height, via breakage, and surface roughness data, and/or wherein the sensor metrology data for depositing includes via nail height distribution and thickness uniformity, delamination, and seam data.

In some embodiments, a method for performing a backside via reveal process may comprise receiving, by a central controller, an initial profile of a substrate and a finished profile of a substrate for the backside via reveal process, receiving, by the central controller, process tool operational parameters from process tools involved in the backside via reveal process, receiving, by the central controller, sensor metrology data from at least one of the process tools involved in the backside via reveal process, determining, by the central controller, two or more individual process tool recipes based on the initial profile, the finished profile, the process tool operational parameters, and the sensor metrology data, wherein the individual process tool recipes are configured to distributively alter the initial profile to produce the finished profile, and transmitting, by the central controller, the two or more individual process tool recipes to associated process tools involved in the backside reveal process, resulting in profile changes to the substrate.

In some embodiments, the method may also include storing, by the central controller, the process tool operational parameters and the metrology sensor data in a database, determining, by the central controller, the individual process tool recipes by using a machine learning model based, at least in part, on the process tool operational parameters, sending and receiving, by the central controller, metrology sensor data between two or more of the process tools involved in the backside reveal process as a substrate is processed to automatically adjust individual process tool recipes by to effect changes before a subsequent substrate is processed in the two or more of the process tools, and/or wherein the backside reveal process includes temporarily bonding and back grinding a backside of the substrate, performing a first chemical mechanical polishing (CMP) process on the backside of the substrate, etching the backside of the substrate to create recesses around vias, depositing a passivation layer on the backside of the substrate, and performing a second CMP process to reveal vias on the backside of the substrate, and/or wherein the sensor metrology data for the bonding and back grinding includes temporary bonding voids, amount of warpage, total thickness variation (TTV), and surface roughness data, wherein the sensor metrology data for the CMP processes include total thickness variation (TTV), embedded via profile, surface roughness, and via breakage data, wherein the sensor metrology data for etching includes recess depth and via height, via breakage, and surface roughness data, and wherein the sensor metrology data for depositing includes via nail height distribution and thickness uniformity, delamination, and seam data.

In some embodiments, a non-transitory, computer readable medium having instructions stored thereon that, when executed, cause a method for performing a backside reveal process to be performed, the method may comprise receiving, by a central controller, process tool operational parameters from process tools involved in the backside via reveal process, receiving, by the central controller, sensor metrology data from at least one or more of the process tools involved in the backside via reveal process, and altering, by the central controller, the backside reveal process based, at least in part, on the process tool operational parameters and the sensor metrology data by adjusting profile parameters of two or more of the process tools involved in the backside via reveal process, wherein the profile parameters are configured to prevent backside via breakage during a chemical mechanical polishing (CMP) process.

In some embodiments, the non-transitory, computer readable medium may comprise a method further including storing, by the central controller, the process tool operational parameters and the sensor metrology data in a database, determining, by the central controller, adjustments for the two or more of the process tools by using a machine learning model based on the process tool operational parameters and the sensor metrology data or sending and receiving, by the central controller, sensor metrology data between two or more of the process tools involved in the backside via reveal process as a substrate is processed to automatically adjust the two or more of the process tools before a subsequent substrate is processed in the two or more of the process tools, temporarily bonding and back grinding a backside of a substrate, etching the backside of the substrate to create recesses around vias, depositing a passivation layer on the backside of the substrate and performing a CMP process to reveal vias on the backside of the substrate, and/or wherein the sensor metrology data for the bonding and back grinding includes temporary bonding voids, amount of warpage, total thickness variation (TTV), and surface roughness data, wherein the sensor metrology data for the CMP process includes total thickness variation (TTV), embedded via profile, surface roughness, and via breakage data, wherein the sensor metrology data for etching includes recess depth and via height, via breakage, and surface roughness data, and wherein the sensor metrology data for depositing includes via nail height distribution and thickness uniformity, delamination, and seam data.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
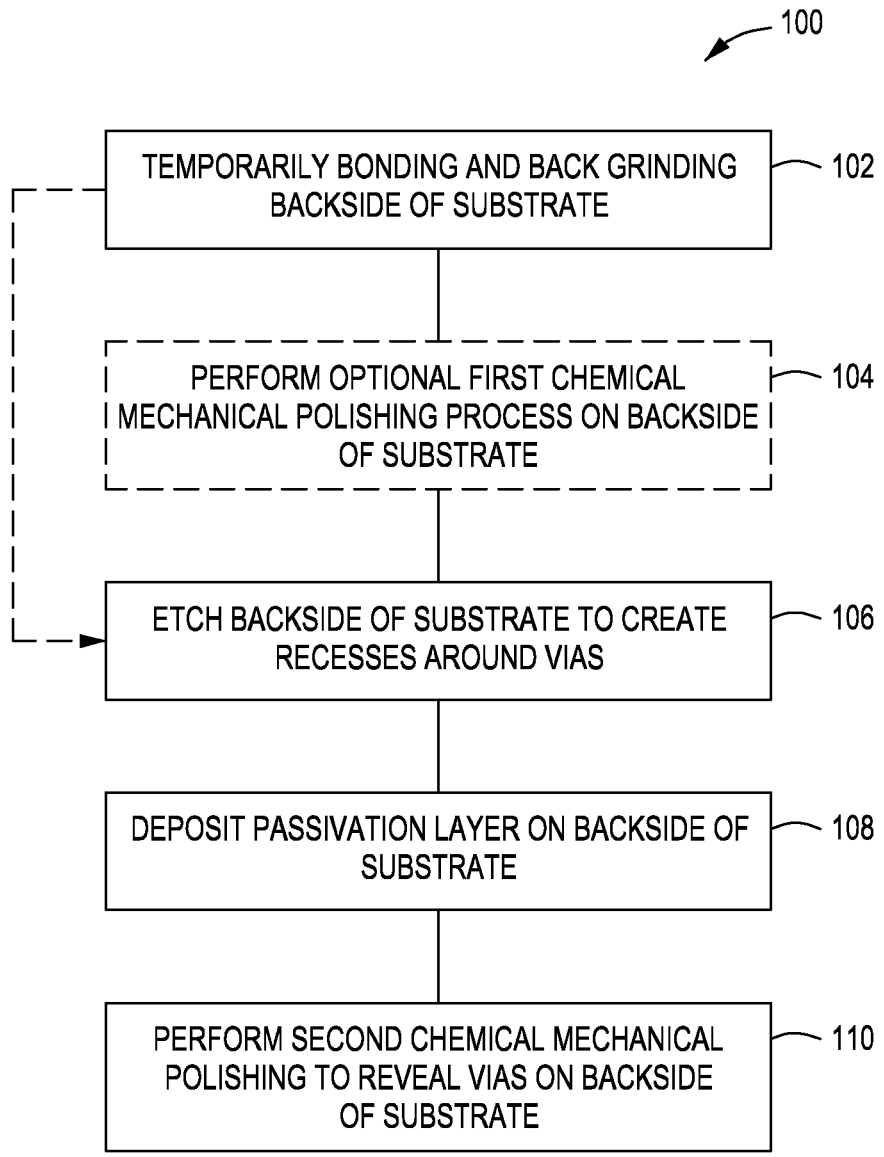
FIG. 1 is a method of performing a backside via reveal process in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a solution to via bending or breaking that may occur during a final chemical mechanical polishing (CMP) procedure of a backside via reveal (BVR) process. Often BVR processes rely solely on the final CMP to correct substrate profiles, and the drastic corrections inevitably lead to via damage. The BVR process is a complex interaction between several procedures in the process which may include, for example, bonding processes, back-grinding processes, etching processes, deposition processes, and two or more polishing processes. By integrating the BVR process and distributing substrate profile changes over the BVR process flow, the via bending or breaking may be prevented.

Metrology data may be leveraged to determine profiles of incoming substrates as well as changes to the substrate's profile along the BVR process flow and after the BVR process is completed. Sensors for receiving metrology data may be placed in the process tools used in the BVR process and/or in a factory interface or load lock of an integrated process tool platform and the like. The metrology data may be obtained by a central controller and used to adjust profile settings in each process tool of the BVR process in real-time and/or stored in a database for further processing. In some embodiments, a model based on machine learning may be used to determine profile and/or operating changes for the process tools used in the BVR process. The framework of the present principles is not limited only to the BVR process and may be incorporated in other process flows as well such as, but not limited to, via middle, via last, redistribution layers (RDL), copper pillar, and/or damascene process flows and the like.

Figure 2:
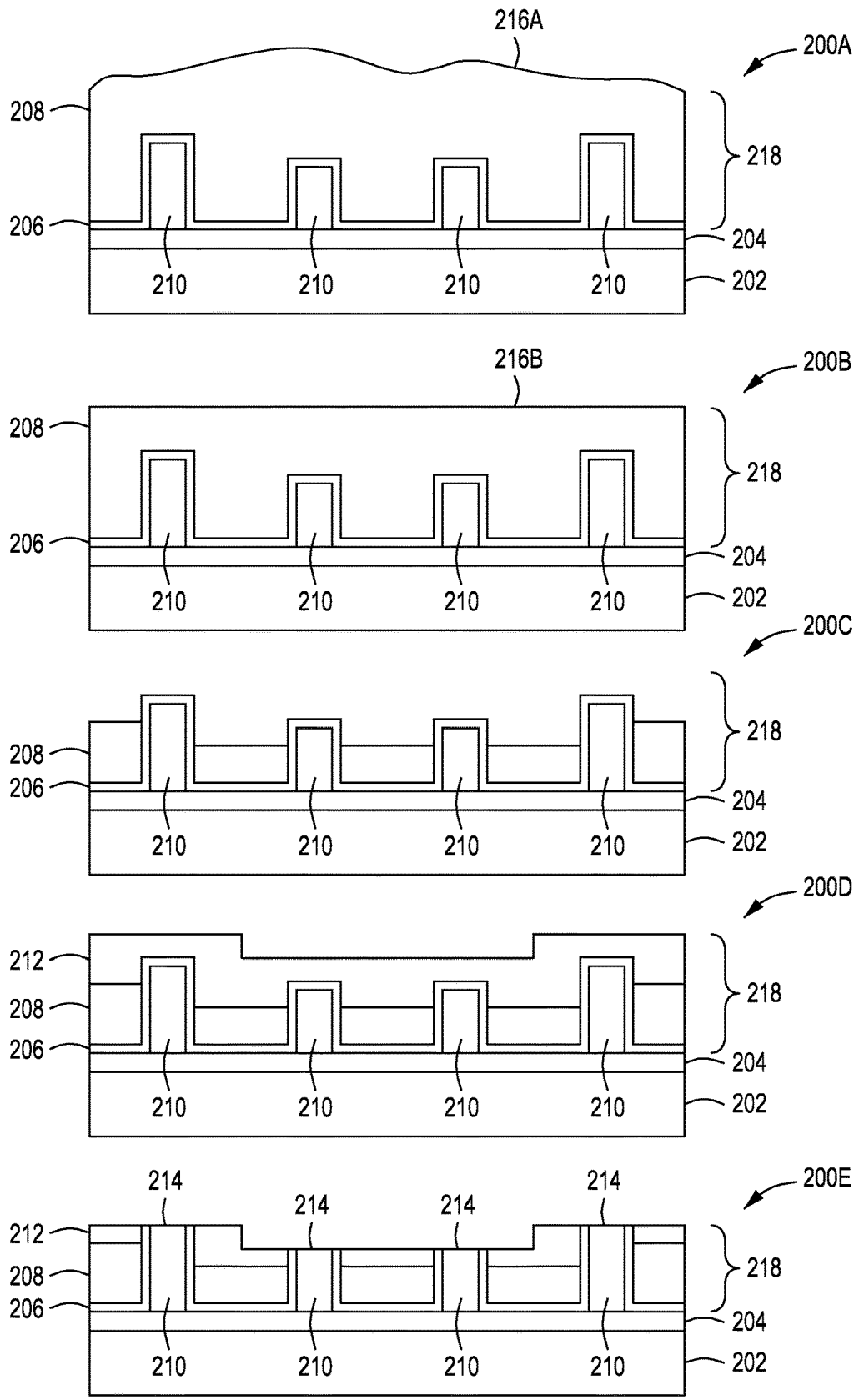
FIG. 2 depicts cross-sectional views of a substrate during a backside via reveal process in accordance with some embodiments of the present principles.

FIG. 1 is a method 100 of performing a BVR process in accordance with some embodiments. In some embodiments, block 104 is an optional process. FIG. 2 depicts cross-sectional views of the substrate during the BVR process in accordance with some embodiments and will be discussed in conjunction with the method 100 of FIG. 1. In block 102, a substrate 218 is temporarily bonded to a carrier 202 via an adhesive layer 204 and undergoes a back-grinding process as shown in views 200A and 200B. The substrate 218 may have previously formed vias 210 with a barrier/liner layer 206 interposed between the vias 210 and a bulk material 208 of the substrate 218. The carrier 202 provides rigidity to the substrate 218 during processing and is removed at a later stage of processing. A backside surface 216A of the substrate 218 may be nonuniform and may require a back-grinding procedure to level the backside surface 216A of the substrate 218 into the backside surface 216B. The back-grinding may also reduce or eliminate some warpage of the substrate 218. In some cases, the carrier 202 may not be properly centered on the substrate 218 and/or the back-grinding process may not have properly removed gouges or other defects in the backside surface 216B, leading to other issues as the substrate 218 moves through the BVR process flow. In some cases, a high level of warpage may not be fully removed during the back-grinding process, possibly leading to a low center profile and high edge profile on the substrate 218.

In block 104, an optional first CMP process is performed on the backside surface 216B. The optional first CMP process polishes the backside surface 216B of the substrate 218 so that subsequent processes in the BVR process flow may achieve a desired profile at each of the processes. The degree of polishing by the optional first CMP process may directly impact the success of a subsequent etch process. Too little polishing and the etch process will not adequately remove enough of the dielectric layer to reveal the vias 210. Too much polishing and the etch process may reveal too much of the vias and cause them to bend or break during subsequent CMP processes. In some embodiments, the optional first CMP process of block 104 is skipped and a substrate will move from the back-grinding process of block 102 directly to an etch process of block 106. In block 106, the backside of the substrate 218 is etched to create recesses around the vias 210 as depicted in a view 200C. Portions of the bulk material 208 are etched away to reveal the vias 210. The barrier/liner layer 206 still covers the vias 210. The bulk material 208 is etched to allow for a passivation layer 212 to be deposited on the vias 210. If the etch rate is too low, the vias 210 will not be exposed and the passivation layer 212 will be deposited on the bulk material 208 and not cover the vias 210. If the etch rate is too aggressive, a subsequent passivation layer may not be thick enough to fully encompass the vias 210, leading to poor performance and also bending and breaking of the vias 210 in subsequent CMP processes.

In block 108, the passivation layer 212 is deposited on the substrate 218 as depicted in a view 200D. In some embodiments, the deposition process is performed in a CVD process chamber and the like. As previously described, the success of the passivation layer deposition process is influenced by prior processes such as the optional first CMP process and the etch process. In block 110, a second CMP process is performed to reveal or expose top surfaces 214 of the vias 210 as depicted in a view 200E. The top surfaces 214 of the vias 210 are used for subsequent electrical connections to other circuits and/or as inputs/outputs for existing circuits on the substrate 218. The success of the second CMP process is heavily dependent on the prior processes in the BVR process flow as discussed above.

Figure 3:
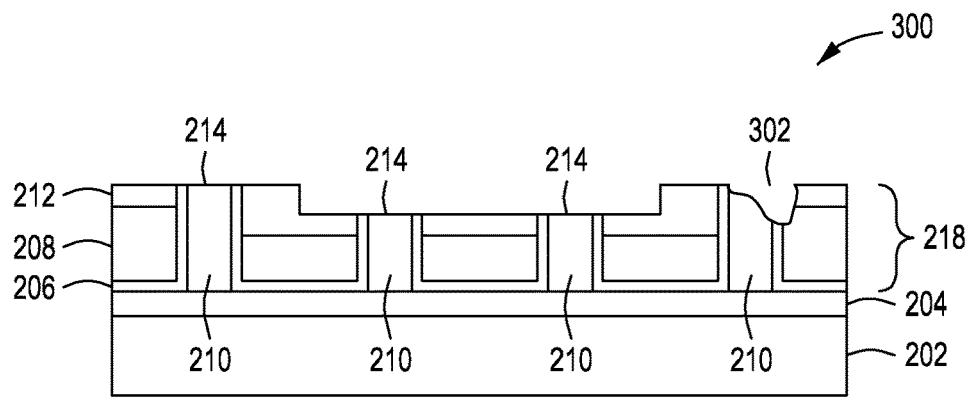
FIG. 3 depicts a cross-sectional view of a substrate after a second chemical mechanical process in accordance with some embodiments of the present principles.

FIG. 3 depicts a cross-sectional view 300 of a substrate after a second CMP process in accordance with some embodiments. When prior processes in the BVR process flow create circumstances (back-grinding unable to remove warpage, incorrect optional first CMP process profile, etching too deep/shallow, passivation layer too thin, etc.) that the second CMP process profile cannot adequately compensate for, bending and/or breaking of the vias 210 may occur. In the cross-sectional view 300 of FIG. 3, a gouge 302 in the backside of the substrate 218 has occurred, damaging the substrate 218. Although the second CMP process may be able to compensate for minor process tolerances in each of the prior process tools, the inventors have found that large discrepancies caused by a cumulative effect that may occur when two or more processes have profiles that produce a substrate surface for which the second CMP process cannot compensate, leading to damage of the substrate during the second CMP process.

Figure 4:
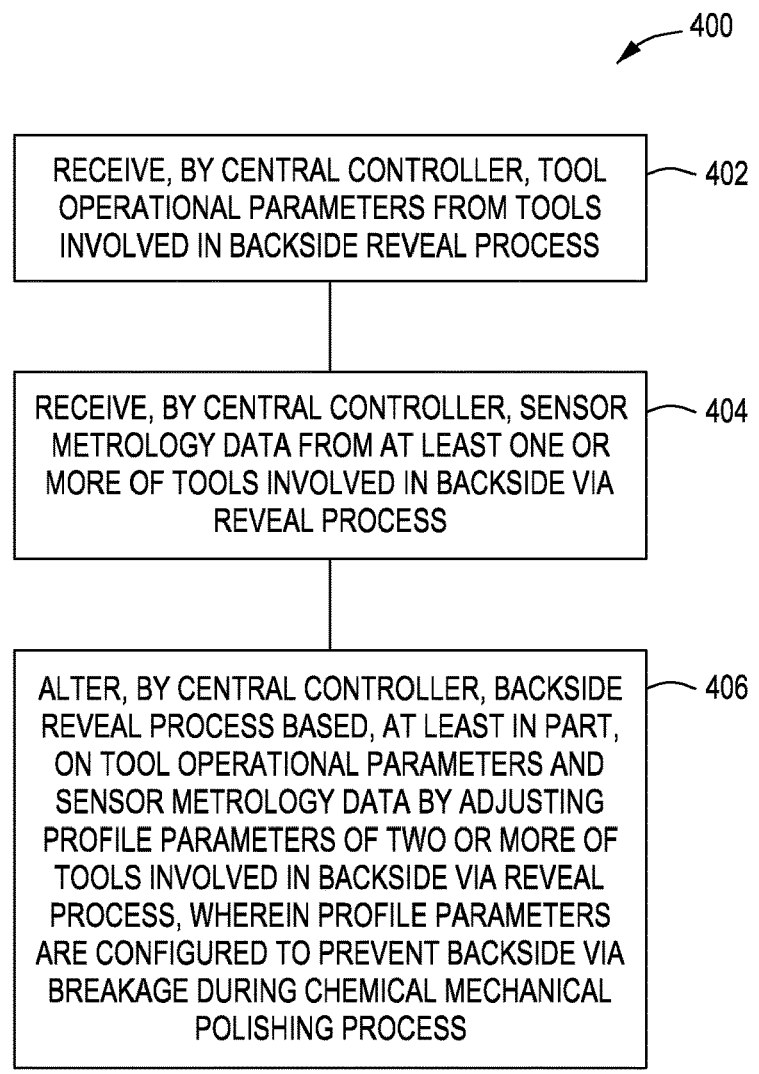
FIG. 4 is a method of performing a backside via reveal process to enhance control over a BVR process in accordance with some embodiments of the present principles.
Figure 5:
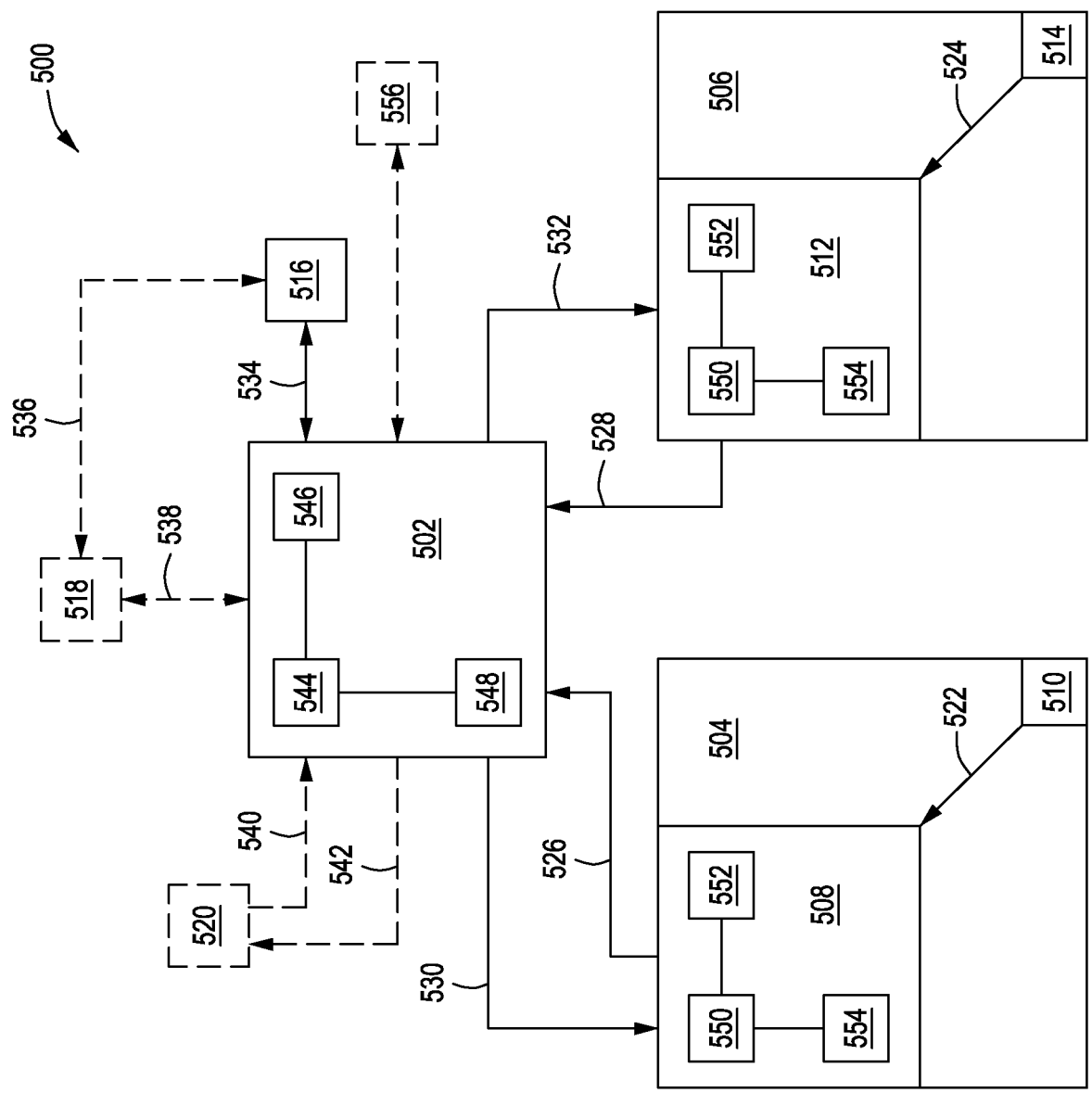
FIG. 5 depicts a cross-sectional view of a framework for integrating the BVR process flow in accordance with some embodiments of the present principles.

The inventors have discovered that by using an integrated approach over the BVR process flow, bending or breaking of vias during the second CMP process may be eliminated, leading to a higher yield and better performance parameters of the substrates produced. FIG. 4 is a method 400 of performing a BVR process to enhance control over a BVR process in accordance with some embodiments. FIG. 5 depicts a cross-sectional view of a framework 500 for integrating the BVR process flow in accordance with some embodiments and will be used in discussing the method 400. In block 402, a central controller 502 receives process tool operational parameters from process tools involved in the BVR process flow. The process tool operational parameters may include, but are not limited to, minimum and/or maximum processing times, minimum and/or maximum etch rates, minimum and/or maximum deposition rates, minimum and/or maximum removal rates, minimum and/or maximum chamber pressures, and/or minimum maximum chamber temperatures, and/or slurry types and the like.

In block 404, in some embodiments, the central controller 502 receives sensor metrology data from at least one or more of the process tools involved in the BVR process flow. In some embodiments, the central controller 502 receives sensor metrology data from at least two or more of the process tools involved in the BVR process flow. Examples of different types of metrology data are discussed in more detail below. The central controller 502 is in communication with a first controller 508 of a first process tool 504 and second controller 512 of a second process tool 506. In some embodiments, the first process tool 504 may have a first metrology sensor 510 that communicates 522 metrology data to the first controller 508. The first controller 508 communicates 526 first process tool operational parameters and/or metrology data, if available, to the central controller 502. Similarly, the second process tool 506 may have a second metrology sensor 514 that communicates 524 metrology data to the second controller 512. The second controller 512 communicates 528 second process tool operational parameters and/or metrology data, if available, to the central controller 502. As discussed above, in some embodiments, the central controller 502 may also be in communication with metrology sensors that are not embedded in process tooling such as the factory interface and/or load lock and the like. In block 406, the central controller 502 may alter the BVR process based, at least in part, on the process tool operational parameters and/or sensor metrology by adjusting profile parameters of two or more of the process tools involved in the BVR process flow. The profile parameters are configured to prevent backside via breakage during a chemical mechanical polishing (CMP) process.

In some embodiments, the central controller 502 may be in communication 534 with a data store 516 in which the central controller 502 may store the metrology data and/or the process tool operational parameters in a data store 516. In some embodiments, the central controller 502 may be in communication 538 with a model 518 that is in communication 536 with the data store 516. The model may be based on machine learning techniques and the like and may leverage historical metrology data, real-time data, and/or process tool operational parameters and the like. In some embodiments, the central controller 502 may also be in communication 540, 542 with other process tools 520. The central controller 502 may use the model 518 and/or historical data stored in the data store 516 to facilitate in determining how the process profiles of the first process tool 504 and the second process tool 506 may be altered to prevent breakage during a CMP process. Because the central controller 502 is aware of the process tool operational parameters and/or metrology data associated with each of the process tool's process outputs, the central controller 502 can make the determination as to whether the combined process tool processes will produce a substrate profile which cannot be compensated by a CMP process, preventing damage to the substrate as the substrate moves through the BVR process flow. After the determination, the central controller 502 communicates 530 any profile adjustments to the first process tool 504 and/or communicates 532 any profile adjustments to the second process tool 506. The profile adjustments may be made in real-time, prior to a substrate run (e.g., based on historical metrology data and/or based on an initial profile—for example, substrates with severe warpage, etc. that will require profile changes different from profiles for non-warped or less warped substrates), and/or after a substrate run. In some embodiments, the central controller 502 may have an interface 556 that enables inputting of profiles such as, for example, an initial profile and/or a finished profile and the like for a substrate. In some embodiments, the interface 556 may be a user interface for substrate profile submissions and/or a digital interface and/or analog interface for use with other computing devices, etc. for substrate profile submissions.

As used herein, the first controller 508 and the second controller 512 control the operation of the first process tool 504 and the second process tool 506 or chambers, respectively, using a direct and/or indirect control of the process tools. In operation, the first controller 508 and the second controller 512 enable data collection from the respective process tools and systems to optimize performance. The first controller 508 and the second controller 512 generally each include a Central Processing Unit (CPU) 550, a memory 552, and a support circuit 554. The CPU 550 may be any form of a general-purpose computer processor that can be used in an industrial setting. The support circuit 554 is conventionally coupled to the CPU 550 and may comprise a cache, clock circuits, input/output subsystems, power supplies, and the like. Software routines, such as a method as described above or below may be stored in the memory and, when executed by the CPU 550, transform the CPU 550 into a specific purpose computer (controllers 508, 512).

The memory 552 is in the form of computer-readable storage media that contains instructions, when executed by the CPU 550, to facilitate the operation of the semiconductor processes and equipment. The instructions in the memory 552 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

As used herein, the central controller 502 controls the operations of the process tools using a direct control of the process tools and/or alternatively, indirectly, by controlling the computers (or controllers) associated with the process tools. In operation, the central controller 502 enables data collection from the respective process tools to optimize performance of the BVR process flow. The central controller 502 generally includes a Central Processing Unit (CPU) 544, a memory 546, and a support circuit 548. The CPU 544 may be any form of a general-purpose computer processor that can be used in an industrial setting. The support circuit 548 is conventionally coupled to the CPU 544 and may comprise a cache, clock circuits, input/output subsystems, power supplies, and the like. Software routines, such as a method as described above may be stored in the memory and, when executed by the CPU 544, transform the CPU 544 into a specific purpose computer (central controller 502).

The memory 546 of the central controller 502 is in the form of computer-readable storage media that contains instructions, when executed by the CPU 544, to facilitate the operation of the semiconductor processes and equipment. The instructions in the memory 546 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 6:
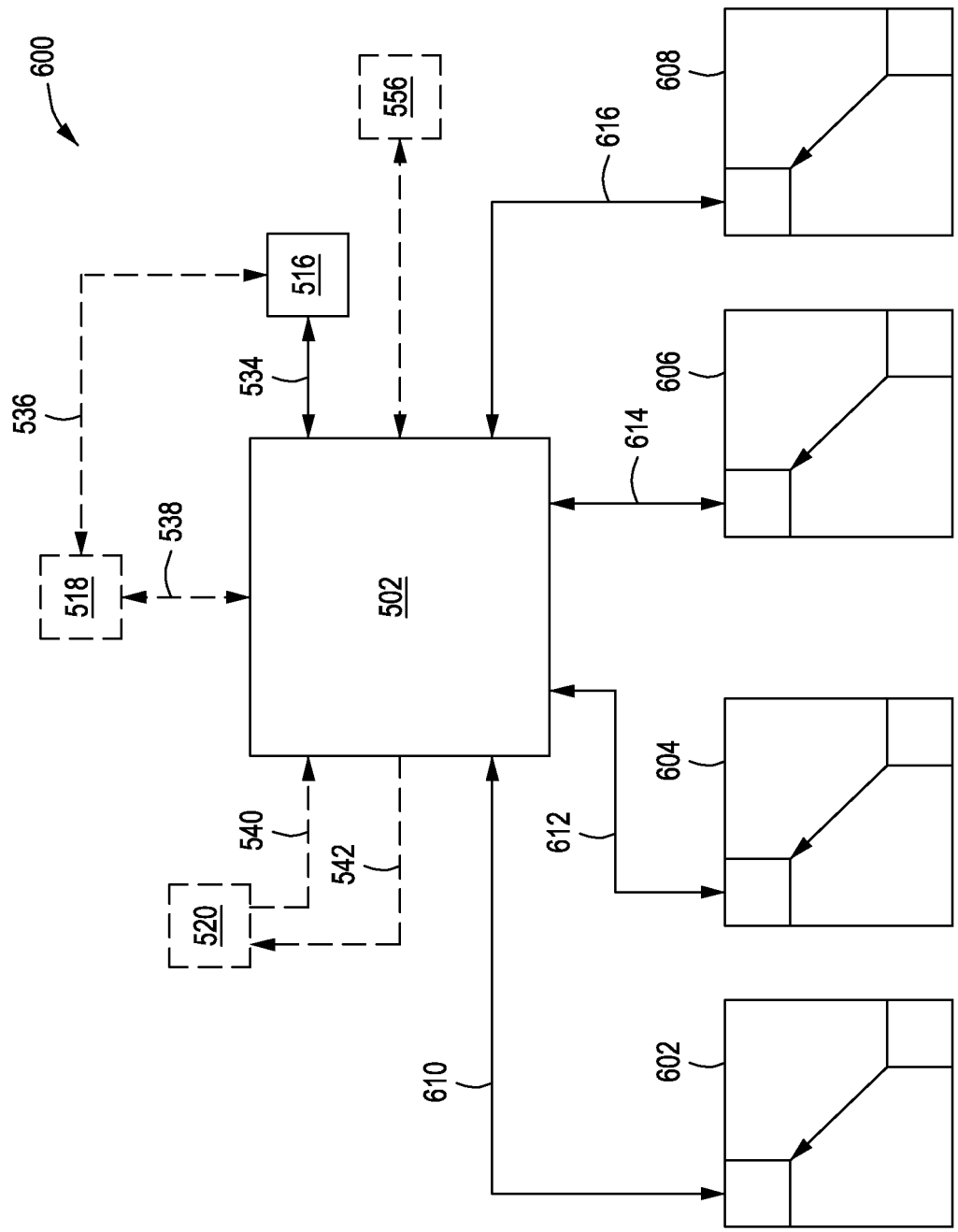
FIG. 6 depicts a cross-sectional view of a framework for performing a backside via reveal process in accordance with some embodiments of the present principles.

FIG. 6 depicts a cross-sectional view 600 of a framework for performing a BVR process in accordance with some embodiments. In the example framework, the central controller 502 is in communication 610 with bonding and back-grinding process tools 602 which bond the substrate to a carrier and back-grind the substrate in preparation for subsequent BVR processes. In some embodiments, the carrier is formed of a glass material. The central controller 502 may receive metrology data from the bonding and back-grinding process tools 602 pertaining to, for example, temporary bonding voids, warpage, total thickness variation (TTV) of the substrate, and/or surface roughness and the like. The central controller 502 may incorporate the metrology data from the bonding and back-grinding process tools 602 for temporary bonding quality assurance and zonal substrate CMP control.

The central controller 502 is also in communication 612 with a CMP process tool 604 which provides an initial polishing process for smoothening the backside surface of a substrate and provides a final polishing process for revealing the vias on the backside surface of the substrate. The central controller 502 may receive metrology data from the CMP process tool 604 for the initial polishing process pertaining to the TTV, the embedded via profile, and/or the surface roughness and the like. In some embodiments, for example, the CMP process tool 604 may incorporate a near infrared sensor that may map the thickness across an entire substrate to provide TTV metrology data and the like. The central controller 502 may incorporate the metrology data from the CMP process tool 604 for incoming through silicon via (TSV) etch uniformity and/or substrate recess etch and the like. The central controller 502 may also use the metrology data to facilitate in tuning the BVR process flow and process tool profiles for center-to-edge TTV control and the like. The central controller 502 may receive metrology data from the CMP process tool 604 for the final polishing process pertaining to via bending and/or breakage and the like. The central controller 502 may incorporate the metrology data from the CMP process tool 604 for substrate recess etch by an etch process tool 606 and/or passivation layer deposition by a CVD process tool 608 and the like. The central controller 502 may also use the metrology data to facilitate in tuning the BVR process flow and process tool profiles for center-to-edge downforce control and the like.

The central controller 502 is also in communication 614 with an etch process tool 606 for etching the substrate around the vias. The central controller 502 may receive metrology data from the etch process tool 606 pertaining to recess depth/via height, via bending and/or breaking, and/or surface roughness and the like. The central controller 502 may incorporate the metrology data from the etch process tool 606 for passivation layer deposition and/or initial CMP polishing of the substrate and the like. The central controller 502 may also use the metrology data to facilitate in tuning the BVR process flow and process tool profiles for M or W shape plasma profile for center-to-edge deposition thickness compensation.

The central controller 502 is also in communication 616 with a CVD process tool 608 for depositing a passivation layer on the substrate. The central controller 502 may receive metrology data from the CVD process tool 608 pertaining to TSV nail height distribution/thickness uniformity, delamination, seam, and the like. The central controller 502 may incorporate the metrology data from the CVD process tool 608 for final CMP polishing of the substrate and/or substrate recess etching and the like. The central controller 502 may also use the metrology data to facilitate in tuning the BVR process flow and process tool profiles for film thickness control.

By having access to metrology data, process tool recipes, and/or other process tool operational parameters, the central controller 502 is able to distribute processing of the substrate over the BVR process flow without requiring, for example, a single process tool, such as a CMP tool, to compensate at the end of the flow for all necessary corrections to the substrate. The central controller 502 is also able to use and/or distribute metrology data and profile information between two or more of the process tools for facilitating in recipe tuning for a given profile of a process tool. The central controller 502 may also use the metrology data to calibrate the BVR process flow and fine tune the BVR process flow before, during, and/or after each processed substrate. For example, a slurry mixture used in an optional first CMP process may prove overly aggressive and cause more material to be removed from the substrate than anticipated. The central controller 502 may receive the metrology data from the CMP process tool, determine a corrective profile tune distributed over two or more subsequent process tools, and communicate the distributive changes to the two or more subsequent process tools in real-time, adjusting for the unexpected results during the optional first CMP process. In another example, the etch process may prove overly aggressive. The central controller 502 may receive etch depth/via height metrology data from the etch process tool and incorporate the changes into a modified profile tune that is, for example, distributed to the deposition process as an increased deposition rate and to the second CMP process as a decreased polishing rate and so forth. Similarly, the central controller 502 may make adjustments for a substrate with higher edge thickness with a higher edge etch rate (by, for example, a etch process tool) and/or a higher center deposition rate (by, for example, a CVD deposition process tool).

The inventors have also discovered that the integrated approach of the present principles allows for determining individual process tool recipes or substrate profiles based on an initial substrate profile and a final substrate profile. As used herein, a "profile" or "substrate profile" refers to the physical parameters of the substrate and a "recipe" or "process tool recipe" refers to tool operational parameter settings that enable a process tool to alter a profile of a substrate. Each individual process tool in a BVR process flow may utilize an incoming profile or the physical parameters of an incoming substrate and an outgoing profile or the physical parameters of an outgoing substrate. When the incoming profile or an outgoing profile is changed, the process tool recipes are altered to compensate for the profile changes. If one of the process tools in the BVR process flow alters an outgoing substrate profile unexpectedly (incorrect recipe or possibly an incoming substrate profile is out of range or not as expected (e.g., warped substrate, etc.)), the altered substrate profile from that process tool will have a cumulative effect as the substrate moves through the BVR process flow.

Figure 7:
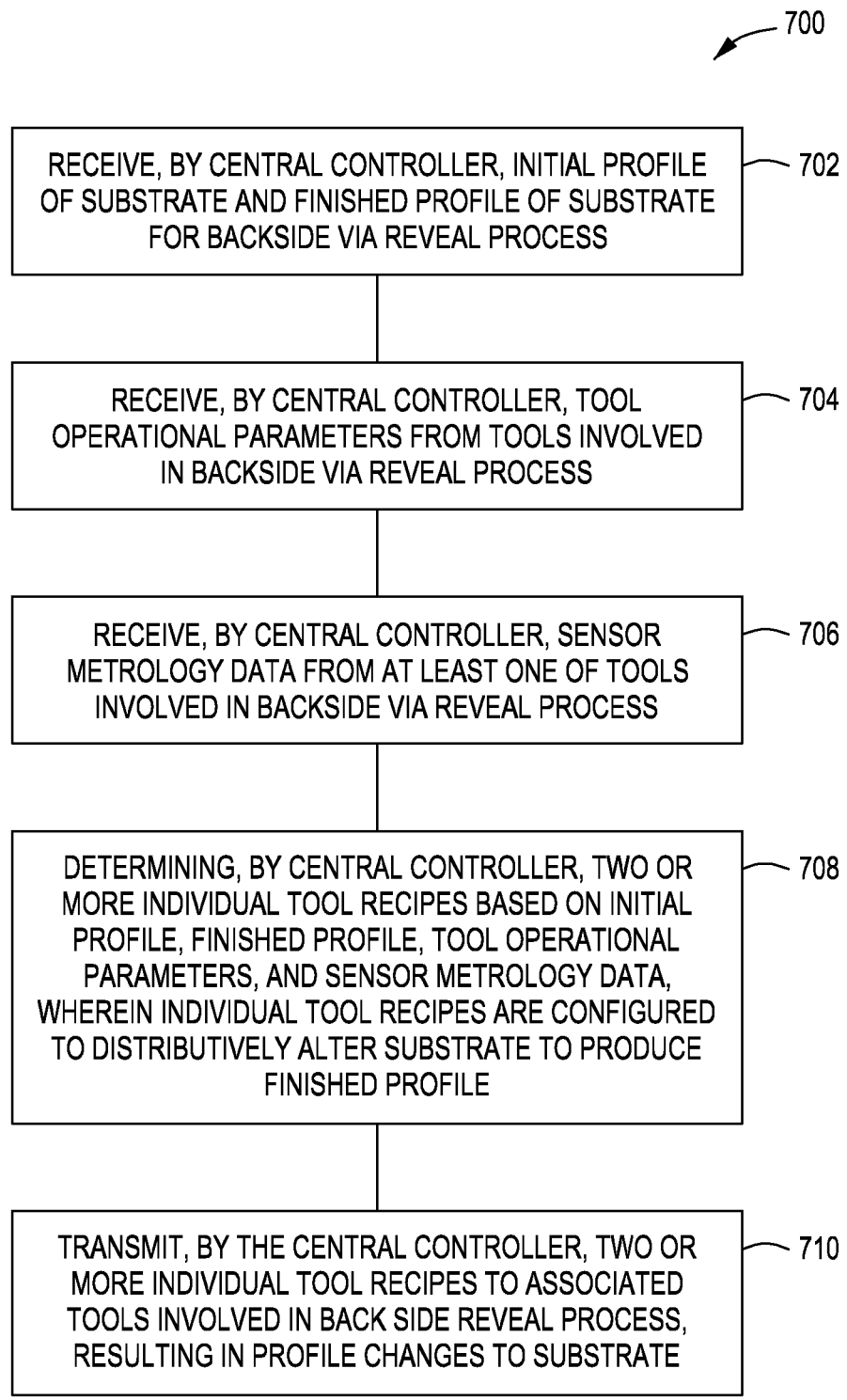
FIG. 7 is a method of performing a backside via reveal process that conforms to a finished profile in accordance with some embodiments of the present principles.

FIG. 7 is a method 700 of performing a BVR process that conforms an initial substrate profile to a finished substrate profile in accordance with some embodiments. In block 702, a central controller receives an initial profile of a substrate and a finished profile of the substrate for a BVR process. The initial profile may be from actual metrology measurements of the substrate and/or from an expected profile (with some margin of error, etc.). In block 704, the central controller receives process tool operational parameters from the process tools involved in the BVR process flow. As noted above, the process tool operational parameters may include, but are not limited to, minimum and/or maximum processing times, minimum and/or maximum etch rates, minimum and/or maximum deposition rates, minimum and/or maximum removal rates, minimum and/or maximum chamber pressures, and/or minimum maximum chamber temperatures, and/or slurry types and the like.

In block 706, the central controller receives sensor metrology data from at least one of the process tools involved in the BVR process flow. The sensor metrology data may include historical metrology data from previous substrate runs. In block 708, the central controller determines two or more individual process tool recipes based on the initial profile, the finished profile, the process tool operational parameters, and the sensor metrology data, wherein the individual process tool recipes are configured to distributively alter the substrate to produce the finished profile. Even if the initial profile of the substrate is inaccurate (not based on actual metrology data), the BVR process flow is adjustable to compensate for differences detected by metrology sensors from the process tools. The metrology data can then be used to facilitate in updating recipes used by the process tools, resulting in profile changes that help to compensate for the unexpected initial profile metrology. In some embodiments, a model based on machine learning may be used to aid in determining the individual tool recipes and profiles. In block 710, the central controller transmits the two or more individual process tool recipes to the associated process tools involved in the BVR process flow, resulting in profile changes to the substrate being processed.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for performing a backside via reveal process, comprising:
    receiving, by a central controller, process tool operational parameters from process tools involved in the backside via reveal process, wherein the process tools include a CMP chamber, an etch chamber, and a chemical vapor deposition (CVD) chamber;
    receiving, by the central controller, metrology sensor data from at least one or more of the process tools involved in the backside via reveal process; and
    altering, by the central controller, the backside reveal process based, at least in part, on the process tool operational parameters and the metrology sensor data by adjusting profile parameters of two or more of the process tools involved in the backside via reveal process, wherein the profile parameters are configured to prevent backside via breakage during a chemical mechanical polishing (CMP) process.

2. The method of claim 1, further including:
    storing, by the central controller, the process tool operational parameters and the metrology sensor data in a database.

3. The method of claim 1, further including:
    determining, by the central controller, adjustments for the two or more of the process tools by using a machine learning model based, at least in part, on the process tool operational parameters and the metrology sensor data.

4. The method of claim 1, further including:
    sending and receiving, by the central controller, metrology sensor data between two or more of the process tools involved in the backside via reveal process as a substrate is processed to automatically adjust the two or more of the process tools before a subsequent substrate is processed in the two or more of the process tools.

5. A method for performing a backside via reveal process, comprising:
    receiving, by a central controller, process tool operational parameters from process tools involved in the backside via reveal process;
    receiving, by the central controller, metrology sensor data from at least one or more of the process tools involved in the backside via reveal process; and
    altering, by the central controller, the backside reveal process based, at least in part, on the process tool operational parameters and the metrology sensor data by adjusting profile parameters of two or more of the process tools involved in the backside via reveal process, wherein the profile parameters are configured to prevent backside via breakage during chemical mechanical polishing (CMP) processes,
    wherein the backside via reveal process includes:
        temporarily bonding and back grinding a backside of a substrate;
        performing a first chemical mechanical polishing (CMP) process on the backside of the substrate;
        etching the backside of the substrate to create recesses around vias;
        depositing a passivation layer on the backside of the substrate; and
        performing a second CMP process to reveal vias on the backside of the substrate.

6. The method of claim 5, wherein the sensor metrology data for the bonding and back grinding includes temporary bonding voids, amount of warpage, total thickness variation (TTV), and surface roughness data.

7. The method of claim 5, wherein the sensor metrology data for the CMP processes include total thickness variation (TTV), embedded via profile, surface roughness, and via breakage data.

8. The method of claim 5, wherein the sensor metrology data for etching includes recess depth and via height, via breakage, and surface roughness data.

9. The method of claim 5, wherein the sensor metrology data for depositing includes via nail height distribution and thickness uniformity, delamination, and seam data.

10. A method for performing a backside via reveal process, comprising:
    receiving, by a central controller, an initial profile of a substrate and a finished profile of a substrate for the backside via reveal process;
    receiving, by the central controller, process tool operational parameters from process tools involved in the backside via reveal process;
    receiving, by the central controller, sensor metrology data from at least one of the process tools involved in the backside via reveal process;
    determining, by the central controller, two or more individual process tool recipes based on the initial profile, the finished profile, the process tool operational parameters, and the sensor metrology data, wherein the individual process tool recipes are configured to distributively alter the initial profile to produce the finished profile; and
    transmitting, by the central controller, the two or more individual process tool recipes to associated process tools involved in the backside reveal process, resulting in profile changes to the substrate,
    wherein the backside via reveal process includes:
        temporarily bonding and back grinding a backside of the substrate;
        performing a first chemical mechanical polishing (CMP) process on the backside of the substrate;

etching the backside of the substrate to create recesses around vias;
depositing a passivation layer on the backside of the substrate; and
performing a second CMP process to reveal vias on the backside of the substrate.

11. The method of claim 10, further including:
storing, by the central controller, the process tool operational parameters and the metrology sensor data in a database.

12. The method of claim 10, further including:
determining, by the central controller, the individual process tool recipes by using a machine learning model based, at least in part, on the process tool operational parameters.

13. The method of claim 10, further including:
sending and receiving, by the central controller, metrology sensor data between two or more of the process tools involved in the backside reveal process as a substrate is processed to automatically adjust individual process tool recipes by to effect changes before a subsequent substrate is processed in the two or more of the process tools.

14. The method of claim 10,
wherein the sensor metrology data for the bonding and back grinding includes temporary bonding voids, amount of warpage, total thickness variation (TTV), and surface roughness data, wherein the sensor metrology data for the CMP processes include total thickness variation (TTV), embedded via profile, surface roughness, and via breakage data, wherein the sensor metrology data for etching includes recess depth and via height, via breakage, and surface roughness data, and wherein the sensor metrology data for depositing includes via nail height distribution and thickness uniformity, delamination, and seam data.

15. A non-transitory, computer readable medium having instructions stored thereon that, when executed, cause a method for performing a backside reveal process to be performed, the method comprising:
receiving, by a central controller, process tool operational parameters from process tools involved in the backside via reveal process;
receiving, by the central controller, sensor metrology data from at least one or more of the process tools involved in the backside via reveal process; and
altering, by the central controller, the backside reveal process based, at least in part, on the process tool operational parameters and the sensor metrology data by adjusting profile parameters of two or more of the process tools involved in the backside via reveal process, wherein the profile parameters are configured to prevent backside via breakage during a chemical mechanical polishing (CMP) process,
wherein the backside via reveal process includes:
temporarily bonding and back grinding a backside of a substrate;
etching the backside of the substrate to create recesses around vias;
depositing a passivation layer on the backside of the substrate; and
performing the CMP process to reveal vias on the backside of the substrate.

16. The non-transitory, computer readable medium of claim 15, further including:
storing, by the central controller, the process tool operational parameters and the sensor metrology data in a database.

17. The non-transitory, computer readable medium of claim 15, further including:
determining, by the central controller, adjustments for the two or more of the process tools by using a machine learning model based on the process tool operational parameters and the sensor metrology data; or
sending and receiving, by the central controller, sensor metrology data between two or more of the process tools involved in the backside via reveal process as a substrate is processed to automatically adjust the two or more of the process tools before a subsequent substrate is processed in the two or more of the process tools.

18. The non-transitory, computer readable medium of claim 15, wherein the sensor metrology data for the bonding and back grinding includes temporary bonding voids, amount of warpage, total thickness variation (TTV), and surface roughness data, wherein the sensor metrology data for the CMP process includes total thickness variation (TTV), embedded via profile, surface roughness, and via breakage data, wherein the sensor metrology data for etching includes recess depth and via height, via breakage, and surface roughness data, and wherein the sensor metrology data for depositing includes via nail height distribution and thickness uniformity, delamination, and seam data.

\* \* \* \* \*